(12) United States Patent
Adusumilli

(10) Patent No.: US 6,418,545 B1
(45) Date of Patent: Jul. 9, 2002

(54) SYSTEM AND METHOD TO REDUCE SCAN TEST PINS ON AN INTEGRATED CIRCUIT

(75) Inventor: Swaroop Adusumilli, Tempe, AZ (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/326,492

(22) Filed: Jun. 4, 1999

(51) Int. Cl.[7] .......................... G01R 31/28; G06F 11/00
(52) U.S. Cl. ...................... 714/729; 714/731; 714/744
(58) Field of Search ................................ 714/729, 731, 714/744

(56) References Cited

U.S. PATENT DOCUMENTS

| | | | | |
|---|---|---|---|---|
| 5,574,853 A | * | 11/1996 | Barch et al. .................. 714/30 |
| 5,592,493 A | * | 1/1997 | Crouch et al. ............... 714/729 |
| 5,636,227 A | * | 6/1997 | Segars ......................... 714/729 |
| 5,663,966 A | * | 9/1997 | Day et al. .................... 714/731 |
| 6,018,815 A | * | 1/2000 | Baeg .......................... 714/726 |
| 6,049,901 A | * | 4/2000 | Stock et al. ................. 714/726 |
| 6,158,032 A | * | 12/2000 | Currier et al. ............... 714/726 |
| 6,178,534 B1 | * | 1/2001 | Day et al. .................... 714/745 |

* cited by examiner

*Primary Examiner*—Albert Decady
*Assistant Examiner*—Joseph D. Torres
(74) *Attorney, Agent, or Firm*—Peter Zawilski

(57) ABSTRACT

The present invention is a system and method that permits appropriate scan testing of internal components of an integrated circuit while reducing the number of external pins required to perform the scan testing. One embodiment of the present invention utilizes standard IEEE 1149.1 pins (e.g. TDO, TDI, TMS, TCK, etc.) to perform both boundary scan and full scan testing. A modified IEEE 1149.1 TAP controller generates signals to control the boundary scan and full scan operations. For example, a full scan cell facilitates full scan capture and shift operations when the TAP controller generates a full scan test mode signal and a full scan enable signal in response to inputs via the standard IEEE 1149.1 pins. In one example the scan enable signal is asserted when the TAP controller is in a shift state and the TAP controller's instruction register is loaded with a test mode instruction. A functional clock capture cycle is applied when the state machine of the TAP controller is in run/idle state.

26 Claims, 8 Drawing Sheets

800

810
Receiving an input scan operation signal associated with scan chains via a first pin.

820
Generating additional scan operation signals associated with a plurality of scan chains based upon the scan operation signal received via the first pin.

830
Controlling scan operations in a plurality of scan chains in accordance with the scan operation signal received via the first pin.

840
Transmitting output scan operation signals off a chip from a plurality of scan chains via a second pin.

FIG. 8

SYSTEM AND METHOD TO REDUCE SCAN TEST PINS ON AN INTEGRATED CIRCUIT

FIELD OF THE INVENTION

The present invention relates to the field of electrical integrated circuit testing. More particularly, the present invention relates to a system and method to reduce scan test pins on an integrated circuit.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems include processors that have facilitated increased productivity and reduced costs in analyzing and communicating data, ideas and trends in most areas of business, science, education and entertainment. Frequently, electronic systems designed to provide these results include a variety of components including microelectronic integrated circuits. Efficient and reliable performance testing of integrated circuit (IC) chips is critical to assure the IC operates properly.

The complexity of commonly used integrated circuits has advanced dramatically and built in self test (BIST) diagnostics capability is essential for effective circuit testing, debugging, and maintenance. Modern BIST techniques typically include the insertion of a scan test architecture in an IC to provide controllability and observability of IC components. Scan testing of complex electronic systems and circuits often requires analysis of measurement points (e.g., appropriately selected circuit nodes) by applying test vectors to stimulate certain aspects (e.g., a functional logic component) of a circuit. For example, microelectronic chips typically have numerous connections between functional logic components in addition to exterior devices and these connections are often appropriate circuit nodes for testing fault isolation and detection.

As a general proposition, information gathered at test measurement points such as circuit nodes are communicated to exterior devices for analysis. Typically scan architectures require additional separate exterior pins dedicated to communicate signals associated with scan testing to devices not on the chip. For example, an International Electrical and Electronic Engineering (IEEE) Standard 1149.1 boundary scan compliant architecture (also referred to as Joint Test Action Group (JTAG)) requires at least 4 pins dedicated to communicate signals associated with scan operations. The IEEE 1149.1 pins are Test Data In (TDI), Test Data Out (TDO), Test Clock (TCK) and Test Mode Select (TMS). Typically, a full scan architecture requires a minimum set of 5 exterior pins per each scan chain. The 5 pins are dedicated to communications associated with full scan operations. The typical minimum full scan pins are scan enable, scan test mode, scan input, scan output and scan test clock.

FIG. 1 is a block diagram example of a prior art boundary and full scan IC architecture 100. Prior art scan architecture 100 comprises normal operation pins 111 through 116, boundary scan cells 121 through 126, functional logic components 131 through 133, full scan chains 141 through 143, full scan test mode (STM) pins 151, 161 and 171, full scan enable (SE) pins 152, 162 and 172, full scan test clock (STC) pins 153, 163, and 173, full scan input (SI) pins 154, 164 and 174, full scan output (SO) pins 155, 165 and 175, boundary scan test data input (TDI) pin 183, boundary scan test mode select (TMS) pin 181, boundary scan test clock (TCK) pin 182 and boundary scan test data output (TDO) pin 184, standard IEEE 1149.1 boundary scan TAP controller 191, instruction register 195, MUX 197 and MUX 198. Normal operation pins 111 through 116 and functional logic components 131 through 133 facilitate normal operations. The remaining listed components of full scan IC architecture 100 facilitate scan mode operations. Each of the full scan chains 141 though 143 and boundary scan cells 121 through 126 require dedicated individual sets of scan operation signals transmitted on separate exterior pins. Each set of pins dedicated to scan operation signals includes a pin for a STM signal, a pin for a SE signal, a pin for a STC signal, a pin for a SI signal, and pin for a SO signal.

Usually the requirement that each scan chain has an individual sets of scan operation signals results in numerous pins being dedicated to scan testing operations. Full scan test mode (STM) pins 151, 161 and 171 are required for the communication of test mode control signals. Full scan enable (SE) pins 152, 162 and 172 are required for the communication of an enable scan signal that controls scan shifting between full scan cells in a scan chain and information loading from functional logic into a scan chain. Full scan test clocks (STC) pins 153, 163, and 173 are required for the transmission of clock signals to components included in a scan chain. Full scan input (SI) pins 154, 164 and 174 are required to provide a path for data signals (e.g., test vectors, instructions, etc.) to a scan chain from exterior devices. Full scan output (SO) pins 155, 165 and 175 are required to transmitted full scan test results to exterior devices. Boundary scan test data input (TDI) pin 181 only inputs information associated with boundary scan operations. Boundary scan test mode select (TMS) pin 181 is only utilized to select a boundary test mode. Boundary scan test clock (TCK) pin 182 is only utilized to generate a boundary scan clock signal. Boundary scan test data output (TDO) pin 183 is only utilized to communicate boundary scan output information to exterior devices.

Usually a complex IC requires a large number of dedicated scan testing pins to accommodate the numerous scan chains included in typical ICs. Although it is important to test an IC, providing dedicated input and output (IO) pins for scan testing operations takes up precious chip space and expends valuable placement resources. Thus, a chip designer often has to expend significant chip resources for scan testing or leave out advantageous scan testing features.

What is required is a system and method that permits appropriate scan testing of internal components while reducing the number of external pins required to perform the scan testing. The system and method should permit a designer to efficiently and effectively scan test integrated circuit components while decreasing the number of external pins dedicated to scan operations. The electronic system and method should minimize adverse redesign impacts to existing IC designs and facilitate utilization of existing testing scan architectures.

SUMMARY OF THE INVENTION

The present invention is a system and method that permits appropriate scan testing of internal components while reducing the number of external pins required to perform the scan testing. The system and method facilitates efficient and effective scan testing of integrated circuit components while decreasing the number of external pins dedicated to scan operations. The electronic system and method also minimizes adverse redesign impacts to existing IC designs and facilitates utilization of existing scan testing architectures.

In one embodiment of the present invention, reduced pin full scan integrated circuit (IC) testing system and method utilizes standard IEEE 1149.1 pins (e.g. TDO, TDI, TMS, TCK, etc.) to perform both boundary scan and full scan testing. A TAP controller generates signals to control both the boundary scan and full scan operations. For example, a full scan cell facilitates full scan capture and shift operations when the TAP controller issues an active full scan test mode signal and an active full scan enable signal (e.g., during shifting). In one embodiment of the present invention the scan test mode signal is a static signal that is programmed by the TAP controller. In one example of a reduced pin scan system, a scan enable signal is asserted when a TAP controller is in a shift state and the TAP controller's instruction register is loaded with a test mode instruction. A functional clock capture cycle is applied when the state machine of the TAP controller is in run/idle state. A TDI pin and TDO pin are utilized to facilitate boundary scan input, boundary scan output, full scan input and full scan output requirements respectively.

BRIEF DESCRIPTION OF THE DRAWINGS

FIG. 8 is a flow chart of IC reduced pin scan test method 800, one embodiment of the present invention.

DETAILED DESCRIPTION OF THE INVENTION

Reference will now be made in detail to the preferred embodiments of the invention, a method and system to reduce scan test pins on an integrated circuit (IC), examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

The present invention reduces the number of pins required to perform scan test operations in ICs that include multiple scan chains. The system and method of the present invention facilitates utilization of a pin to communicate signals associated with scan test operations in different scan chains. In one embodiment of the present invention, a single set of scan test pins are utilized to provided dedicated communication of scan test signals to more than one scan chain. One embodiment of the present invention includes a controller adapted to receive a single set of scan test signals via the set of scan test pins and provide multiple sets of scan operation signals (e.g., scan control signals) to a plurality of scan chains. For example, in one embodiment of the present invention, standard IEEE 1149.1 pins are utilized in both boundary scan operations and full scan operations.

Figure 1:
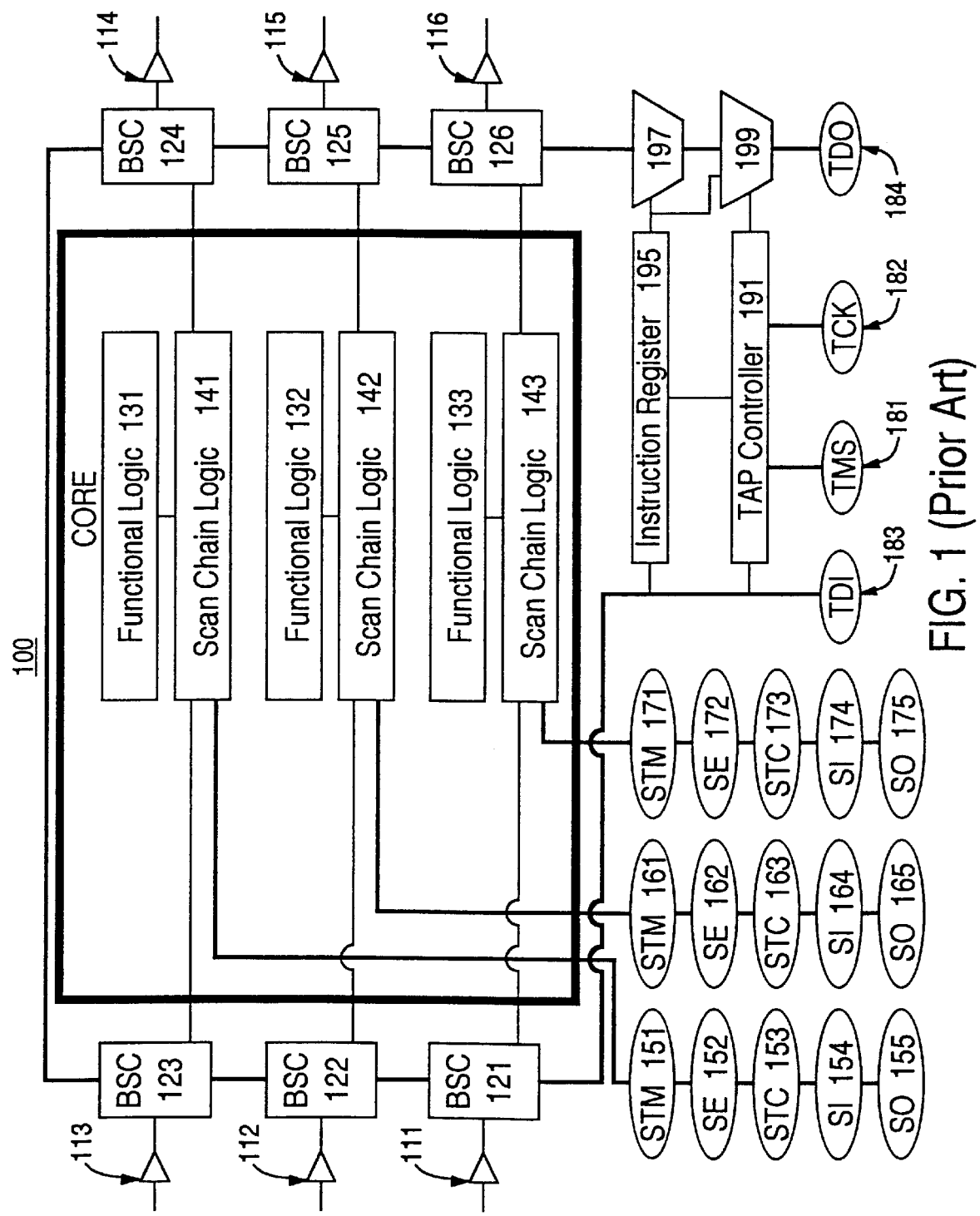
FIG. 1 is a block diagram of a prior art boundary and full scan IC architecture 100.
Figure 2:
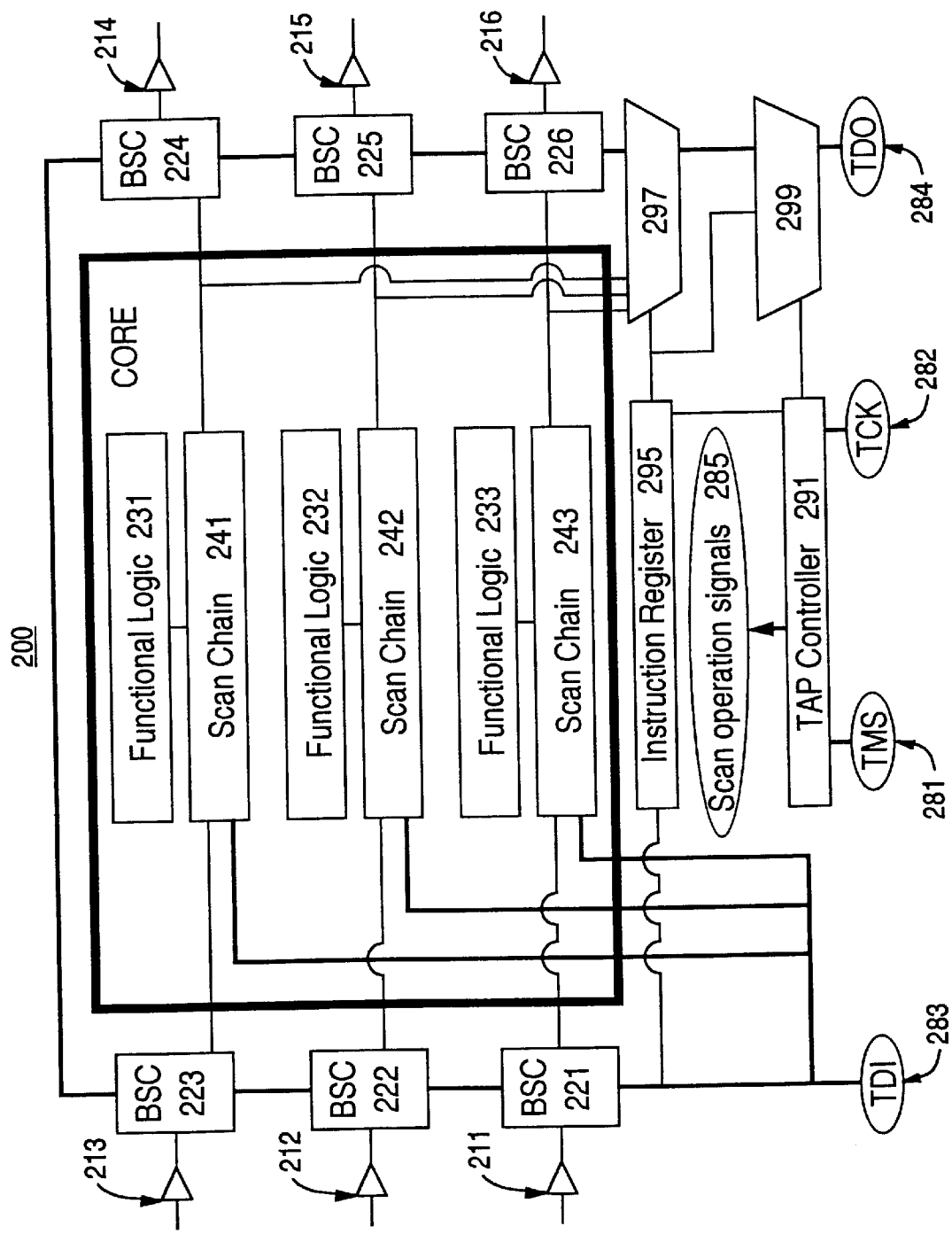
FIG. 2 is a block diagram of reduced scan pin system 200, one embodiment of the present invention.

FIG. 2 is a block diagram of reduced scan pin system 200, one embodiment of the present invention. Reduced scan pin system 200 comprises normal operation input pins 211 through 213, normal operation output pins 214 through 216, boundary scan cells 221 through 226, functional logic components 231 through 233, full scan chains 241 through 243, TAP controller 291, instruction register 295, MUX 297 and MUX 299, boundary scan test mode select (TMS) pin 281, boundary scan test clock (TCK) pin 282, boundary scan test data input (TDI) pin 283, and boundary scan test data output (TDO) pin 284. Boundary scan cells 221 through 226 are coupled sequentially to one another to from a boundary scan chain with boundary scan cell 221 at the beginning coupled to TDI pin 283, TAP controller 291 and instruction register 295, and boundary scan cell 226 at the end of the boundary scan chain coupled to MUX 297. Boundary scan cells 221 through 223 are coupled to input pins 211 through 213 and full scan chains 241 through 243 respectively. Boundary scan cells 224 through 226 are coupled to output pins 214 through 216 and full scan chains 241 through 243 respectively. Full scan chains 241 through 243 are coupled to TAP controller 291 via scan operation signals 285, TDI 283, MUX 297 and functional logic components 231 through 233 respectively. Tap controller 291 is coupled to TDI 283, TMS, 281, TCK 282, instruction register 295 and MUX 299. Instruction register 295 is coupled to TDI 283, MUX 297 and MUX 299 which is coupled to TDO 284.

In another embodiment of reduced scan pin system 200 other optional features of an IEEE 1149.1 compliant chip are included. For example, one embodiment of the present invention also includes a user data register and a bypass register. In addition to the standard set of scan test signals (e.g., TDI, TDO, TMS, and TCK) other signals such as a reset test signal (RTST) are coupled to the TAP controller.

The components of reduced scan pin system 200 provide a functional IC in normal mode with full scan and boundary scan capabilities. The full scan and boundary scan operations are implemented with a reduced number of pins allocated specifically for scan operations. Normal operation input pins 211 through 213 provide an input communication path during normal operations between exterior devices and functional logic components 231 through 243 respectively. Normal operation output pins 214 through 216 provide an output communication path during normal operations between exterior devices and functional logic components 231 through 243 respectively. Boundary scan cells 221 through 226 enable scan data to be shifted in and out of an IC around the exterior boundary. Functional logic components 231 through 233 are utilized to perform normal functional operations. Full scan chains 241 through 243 facilitate the capture of information from functional logic components 231 through 233 respectively, facilitate shifting of scan test information in and out of the core, and registers included in full scan chains 241 through 243 also participate in functional operations. TAP controller 291 interprets scan control signals from exterior devices and directs both boundary scan and full scan operations. Instruction register 295 processes instructions from TAP controller 291. MUX 297 and MUX 299 forward information from communication paths selected by instruction register 295 and TAP controller 291 respectively.

Referring to FIG. 2, the pin set dedicated to the communications of scan test signals of reduced scan pin system 200 comprises TMS 281, TCK 282, TDI 283 and TDO 284. In addition to typical boundary scan functionality, TMS 281, TCK 282, TDI 283 and TDO 284 are also utilized by reduced scan pin system 200 to facilitate full scan operations. For example, by shifting the appropriate command into instruction register 295 the IC is put into full scan test mode. In another embodiment of reduced scan pin system 200 scan chain support features in TAP controller 291 (e.g., user modes) are utilized to put the IC or a scan chain in a full scan test mode. Reduced scan pin system 200 also utilizes a run-test/idle state of TAP controller 291 to facilitate initiation and control of scan enable signals (also referred to as shift enable). When TAP controller 291 is in a state other than run-test/idle, the scan enable signal of reduced scan pin system 200 is high provided the IC is in a scan test mode. In run-test/idle state the full scan enable to the functional logic components is de-asserted. TCK 282 is utilized by reduced scan pin system 200 to facilitate full scan test clock signal requirements. TDI 293 and TDO 294 are utilized by reduced scan pin system 200 to facilitate full scan input signal and full scan output signal requirements respectively.

Figure 3:
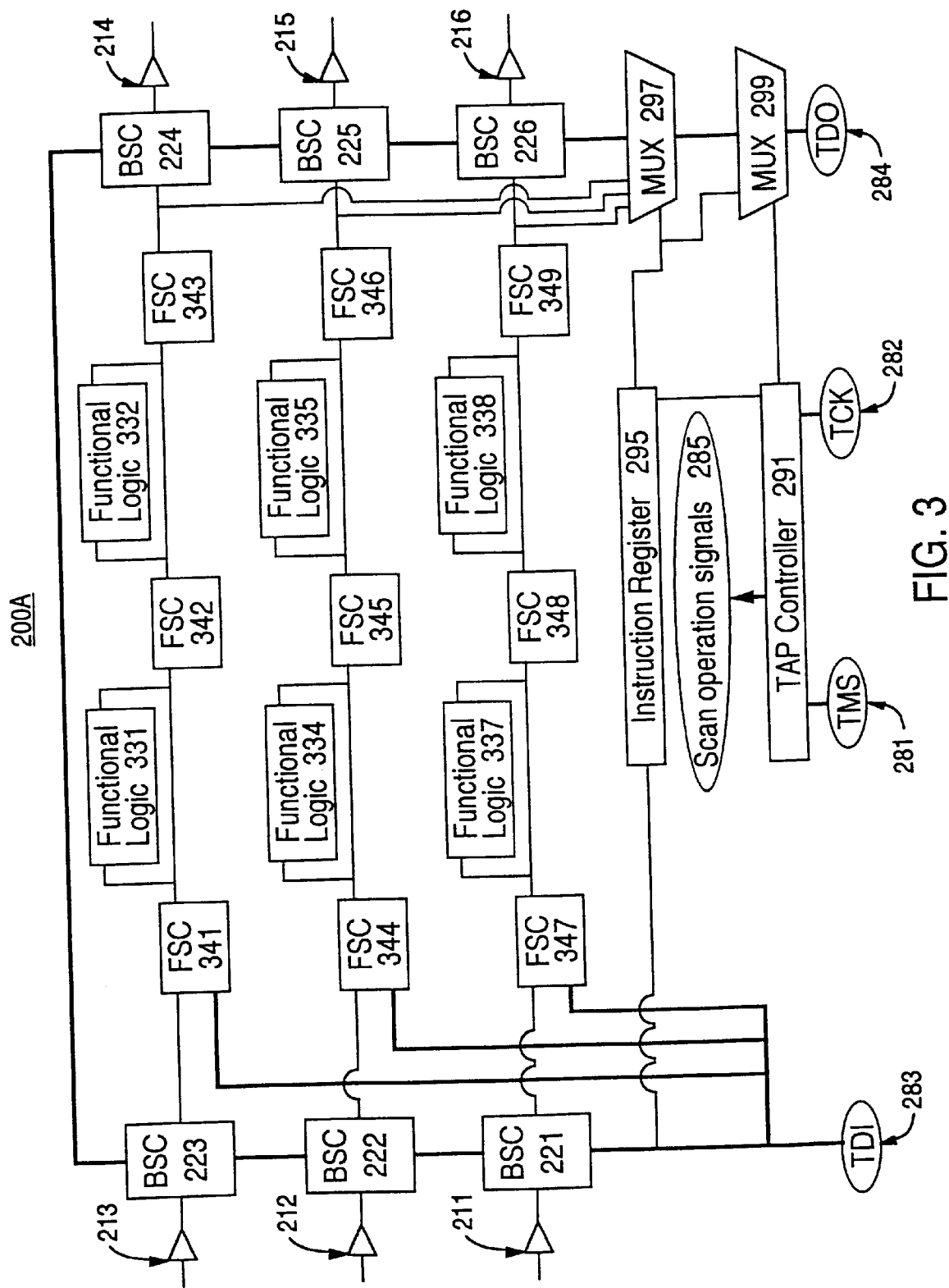
FIG. 3 is a block diagram of reduced scan pin system 200A, one embodiment of reduced scan pin system 200.

FIG. 3 is a block diagram of reduced scan pin system 200A, one embodiment of reduced scan pin system 200. Reduced scan pin system 200A includes a register in a full scan cell (FSC) that facilitates both functional operations and full scan operations. In reduced scan pin system 200A functional logic component 231 comprises functional circuit 331 and 332, functional logic component 232 comprises functional circuit 334 and 335, functional logic component 233 comprises functional circuit 337 and 338. Full scan chain 241 comprises FSC 341 through 343, full scan chain 242 comprises FSC 344 through 346, and full scan chain 243 comprises FSC 347 through 349.

Referring to reduced scan pin system 200A of FIG. 3, the full scan cells included in a scan chain are coupled sequentially to each other. For example, full scan cell 341 is coupled to full scan cell 342 which is coupled to full scan cell 343 to form scan chain 241. The beginning full scan cell in each full scan chain is coupled to TDI 283, TAP controller 291, instruction register 295 and a boundary scan cell coupled to a normal function input pin (e.g., boundary scan cell 223, 222 or 221). The ending full scan cell in each full scan chain is coupled to MUX 297 and a boundary scan cell coupled to a normal function output pin (e.g., boundary scan cell 224, 225 or 226). Thus each of the full scan cells included in reduced scan pin system 200A are controlled by the four IEEE 1149.1 input signals TDI 283, TMS, 281, TCK 282 and TDO 283 (either directly or via scan operation signals 285 generated by TAP controller 291 in response to TDI 283, TMS 281 and TCK 282) and full scan data is shifted on and off the IC via TDI 283 and TDO 283. The full scan cells are also arranged so that the full scan system of reduced scan pin system 200A is capable of manipulating the inputs and capturing the outputs of appropriate functional circuit nodes. For example, the output of FSC 341 is coupled to the input of functional circuit 331 and output of functional circuit 331 is coupled to the input of FSC 342. The output of FSC 342 is coupled to the input of functional circuit 332 which is coupled to the input of FSC 343.

Figure 4:
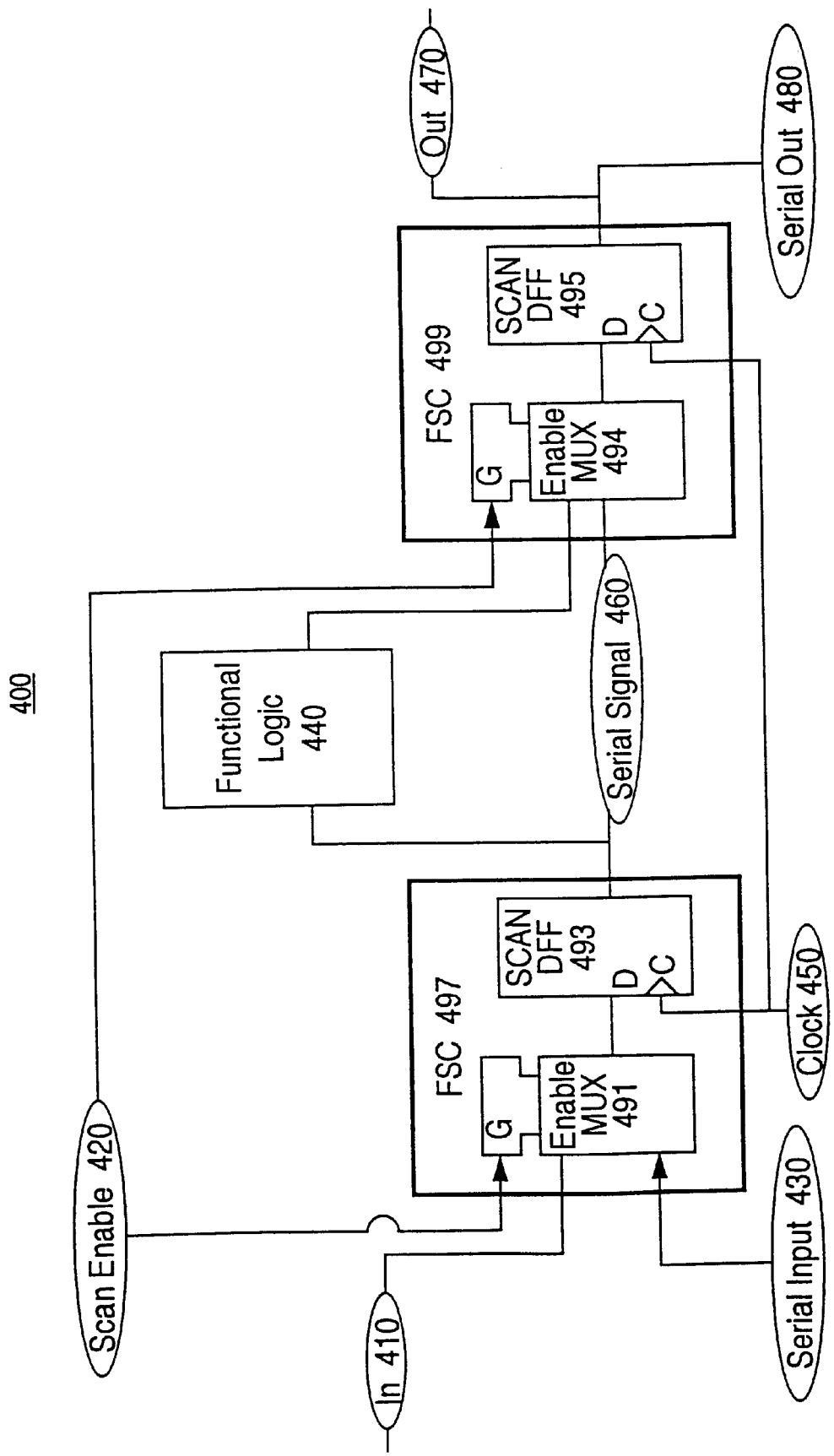
FIG. 4 is a block diagram of full scan cell 400, one embodiment of a full scan cell implemented in the present invention.

FIG. 4 is a block diagram of full scan chain 400, one embodiment of a full scan chain of the present invention. Full scan chain 400 comprises FSC 497, FSC 499 and functional circuit 440. The output of FSC 497 is coupled to functional circuit 440 which is coupled to the input of FSC 499. Full scan cell 497 comprises enable MUX 491 and scan D flip flop (FF) 493. Enable MUX 491 is coupled to normal data in signal 410, scan serial input signal 430, scan enable signal 420, and scan DFF 493. Scan DFF 493 is also coupled to clock signal 450, scan serial signal 460 and FSC 499. Full scan cell 499 comprises enable MUX 494 and scan D flip flop (DFF) 495. Enable MUX 494 is coupled to functional circuit 440, scan serial signal 460, scan enable signal 420, and scan DFF 495. Scan DFF 495 is also coupled to clock signal 450, normal data out signal 470 and scan serial output signal 480.

Full scan chain 400 facilitates testing of functional circuit 440 during scan test operations. Enable MUX 491 selects normal data in signal 410 or serial data input signal 430 for transmission to scan DFF 493 depending upon the logical state of scan enable signal 420. When scan enable signal 420 is active data is serially shifted into and out of DFF 493 and 494. Scan DFF 493 latches the signal from enable MUX 491 and transmits the signal to functional circuit 440 and as scan serial signal 460 to DFF 494 based upon cycles in clock signal 450. Thus, data is provided to functional circuit 440 via DFF 440 from normal data in signal 410 if scan enable signal 420 is not active or serial input signal 430 if scan enable signal 420 is active. To capture the output of functional circuit 440 after it has acted upon the desired test data, scan enable signal 420 is deasserted. By deasserting scan enable signal 420 MUX 494 does not forward the serial signal 460 from scan DFF 495, instead MUX 494 forwards the output of functional circuit 440 to scan DFF 495. After the output of functional circuit 440 is transferred to Scan DFF 495 it is output either as normal output 470 signal through a normal operation output pins or as serial output signal 480 via other FSCs or directly to TDO.

Figure 5:
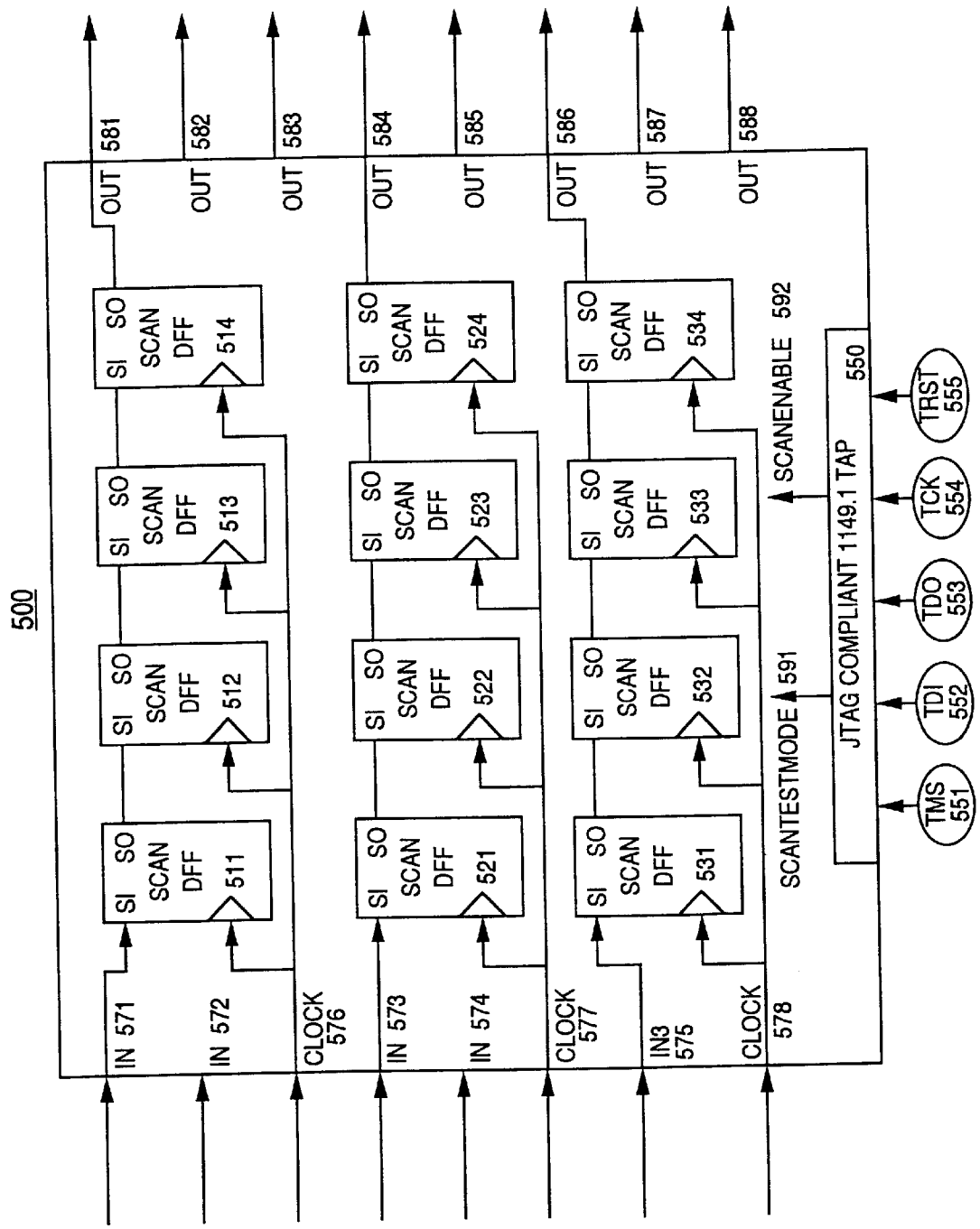
FIG. 5 is a block diagram of reduced scan pin system 500, one embodiment of the present invention.

FIG. 5 is a block diagram of reduced scan pin system 500, one embodiment of the present invention. In one example, reduced scan pin system 500 comprises a part of an IC core component. Reduced scan pin system 500 comprises scan DFF 511 through 534, input ports 571 through 575, clock port 576 through 578, output ports 581 through 588, and TAP controller 550. For ease of discussion full scan cells are presented by scan DFF 511 through 534. Scan DFF 511 through Scan DFF 514 are coupled to clock port 576 and sequentially coupled to each other to form a scan chain with scan DFF 511 at the beginning coupled to input port 571 and scan DFF 514 at the end coupled to output port 581. Scan DFF 521 through Scan DFF 524 are coupled to clock port 577 and sequentially coupled to each other to form a scan chain with scan DFF 521 at the beginning coupled to input port 573 and scan DFF 524 at the end coupled to output port 584. Scan DFF 531 through Scan DFF 534 are coupled to clock port 578 and sequentially coupled to each other to form a scan chain with scan DFF 531 at the beginning coupled to input port 575 and scan DFF 534 at the end coupled to output port 586. In one embodiment of reduced scan pin system 500, input ports 571 through 575 are coupled to normal operation input pins and output ports 581 through 588 are coupled to normal operation output pins.

Referring to FIG. 5, in one embodiment of the present invention the input ports 571 through 575 and output ports 581 through 588 represent the normal mode functional inputs and outputs, whether they come from the normal input and normal output pins directly or via other logic components. The normal functional inputs and outputs operate in "scan mode" to facilitate full scan inputs and full scan outputs when directed to operate in scan mode by scan operation signals from TAP controller 550. In one embodiment of the present invention, shifting occurs when both the full scan test mode signal and the full scan enable signal are active. In another embodiment of the present invention input ports 571 through 575 and output ports 581 through 588 are coupled to other full scan chains. TAP controller pins 151 through 555 are coupled to TAP controller 550 and are utilized as an interface for scan test signals.

In one embodiment of reduced scan pin system 500 full scan inputs (SI) and full scan outputs (SO) in each scan DFF facilitate full scan capture and shift operations when a full scan test mode signal 591 is active and a full scan enable signal 592 is active (e.g., during shifting). When full scan test mode signal 591 and scan enable signal 592 are not active the IC operates in normal mode including input ports 571 through 575 and output ports 581 through 588, providing normal operation communication paths for functional logic components. In one embodiment the normal clock pins 576 through 578 are utilized in both normal operation mode and scan test mode. In this embodiment, scan test mode signal 591 is a static signal that is programmed by TAP controller 550. In one example of a reduced pin scan system 500, scan enable signal 592 is asserted when TAP controller 550 is in shift state and TAP controller's 550 instruction register(not shown) is loaded with a test mode instruction. The functional clock capture cycle is applied when the state machine of TAP controller 550 is in run/idle state.

Figure 6:
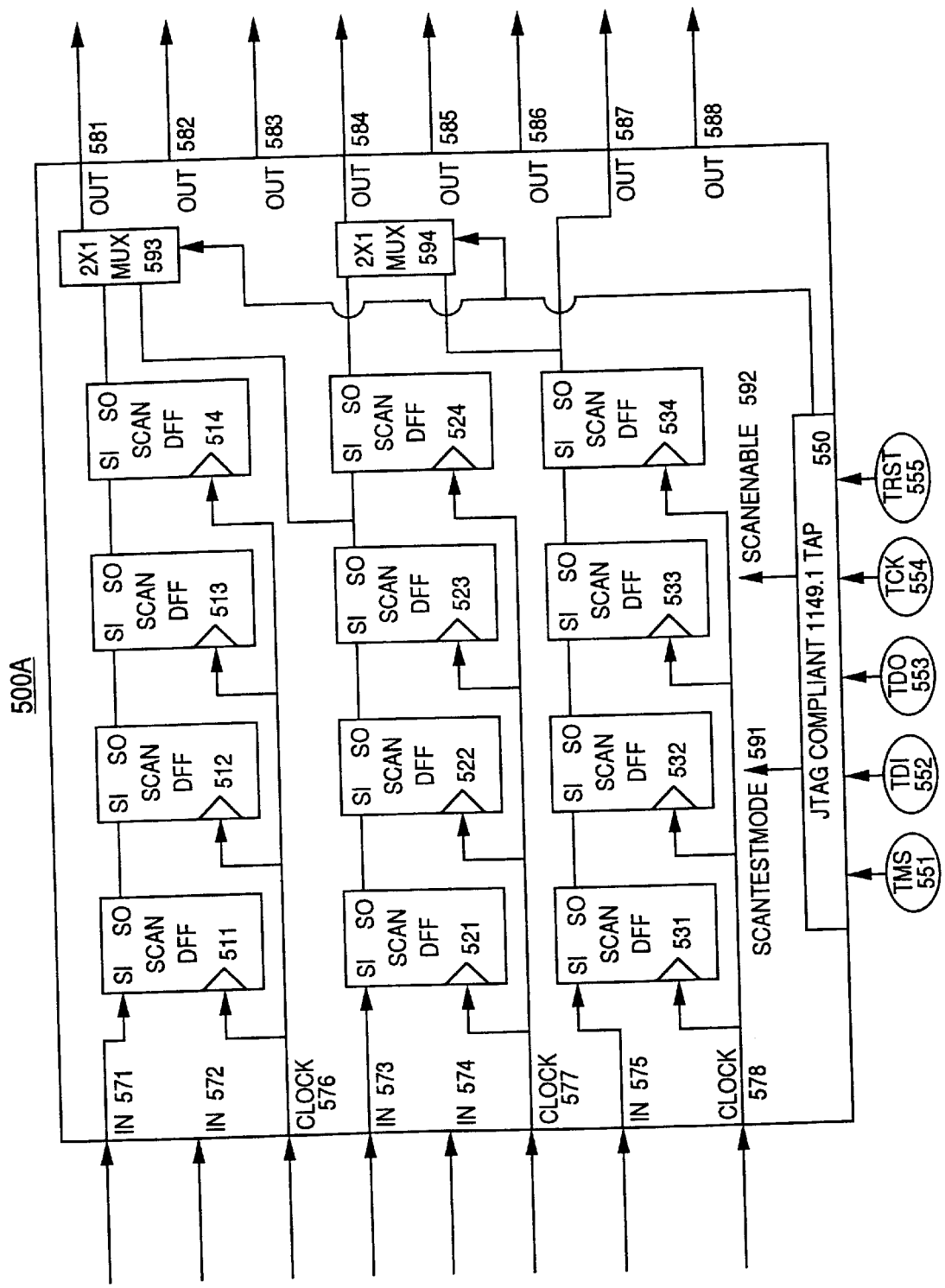
FIG. 6 is a block diagram of reduced scan pin system 500A, one embodiment of reduced scan pin system 500.

In one embodiment of the present invention the outputs of the IC do not come directly from a D flip flop, instead they are generated indirectly via a combination logic component permitting the outputs of the IC during normal function cycles to be different from those during scan test mode. In one example, the combination logic includes multiplexing of outputs between normal function logic operations and full scan test mode operations. FIG. 6 is a block diagram of reduced scan pin system 500A, one embodiment of the present invention. Reduced scan pin system 500A is similar to reduced scan pin system 500 except the final output of a scan chain is multiplexed. Reduced scan pin system 500A comprises scan chain output MUXs 593 and 594 in addition to components similar to reduced scan pin system 500. Scan chain output MUX 593 is coupled to scan DFF 514, scan DFF 523, TAP controller 550 and output port 581. Scan chain output MUX 594 is coupled to scan DFF 524, scan DFF 534, TAP controller 550 and output port 584. In one embodiment of the present invention, a "scan enable" signal derived from a run-test/idle state in TAP controller 550 is utilized to control MUX 593 and MUX 594.

Figure 7:
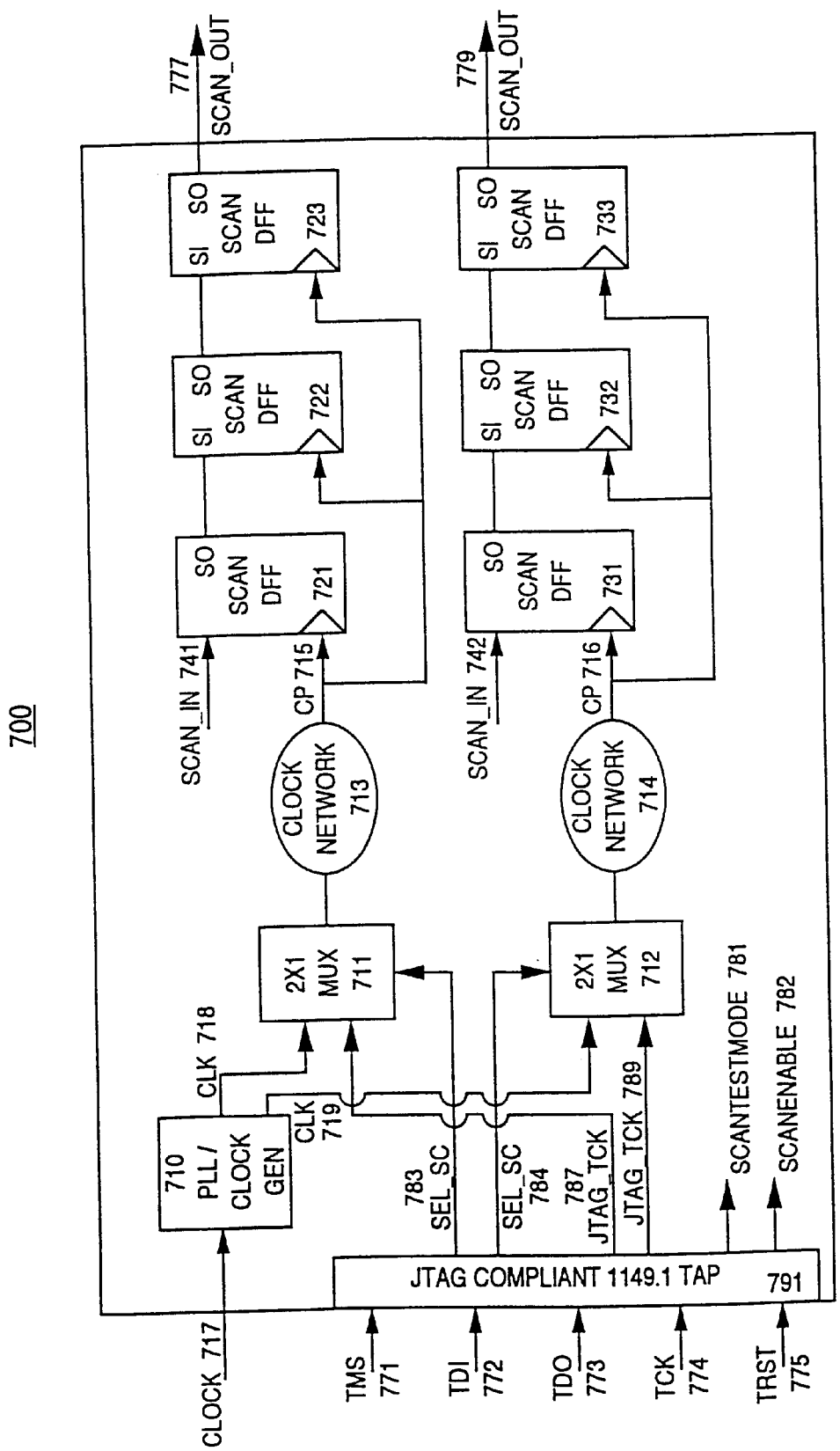
FIG. 7 is a block diagram of reduced scan pin system 700, another embodiment of the present invention.

FIG. 7 is a block diagram of reduced scan pin system 700, another embodiment of the present invention. Reduced scan pins system 700 comprises phase lock loop (PLL)/clock generator 710, MUX 711, MUX 712, clock network 713, clock network 714, scan DFF 721 through 733, and TAP controller 791. MUX 711 is coupled to PLL/clock generator 710, TAP controller 791, and clock network 713 which is coupled to scan DFF 721 through 723. MUX 712 is coupled to PLL/clock generator 710, TAP controller 791, and clock network 714 which is coupled to scan DFF 731 through 733. Scan test mode signal 781 and scan enable 782 are coupled to full scan cells associated with scan DFF 721 through 733. Scan DFFs 721 through 723 are sequentially coupled to form one scan chain and scan DFFs 731 through 733 are sequentially coupled to form another scan chain. TAP controller pins 771 through 771 are coupled to TAP controller 791 and are utilized as an interface for scan test signals.

In reduced scan pin system 700 multiple exterior clock signals are not provided to the IC from exterior devices. In one embodiment of reduced scan pin system 700 one clock signal 717 is provided and reduced scan pin system 700 multiplies and/or divides the signal by PLL/clock generator 710 within the IC to generate multiple internal clock signals (e.g., clock signal CLK 718 and CLK 719). In one embodiment the clock signals are in phase and in another they are asynchronous to one another. Thus, reduced scan pin system 700 is capable of facilitating different scan chains with different clock domains. In one embodiment, reduced scan pin system 700 multiplexes the clock signals to individual domains by creating individual clocks from the TAP controller off of TCK such as JTAG_TCK 787 and JTAG_TCK 789. The logic components (e.g., gates) utilized to create the individual clocks is performed at a top level enabling skews to be minimized by the time the clock signal propagates to the individual nodes (e.g., scan DFFs 721 through 733). Reduced scan pin system 700 also permits TAP controller 791 to individually program each scan chain or multiple scan chains at the same time.

In a different embodiment of reduced scan pin system 700, TAP controller 791 generates gating signals and gates multiple clocks individually instead of multiplexing. Thus, as much originality as in functional mode is retained with the exception of gating. For example in one embodiment, MUXs 711 and 712 are replaced with AND gates and signals JTAG_CLK 787 AND JTAG_CLK 789 are replaced by a first JTAG_GAT signal and a second JTAG_GAT signal respectively. In one embodiment of the present invention, the clock input to the IC is as fast as the gating logic. For example, by using PLL by-pass mode and/or bypassing the clock generator itself. In another embodiment the scan enable signal 782 out of TAP controller 791 is synchronous to signal CP 715 and/or signal CP 716 whenever the two individual scan chains are programmed independently and/or simultaneously.

FIG. 8 is a flow chart of IC reduced pin scan test method 800, one embodiment of the present invention. Integrated circuit reduced pin scan test method 800 provides a method of communicating with multiple scan chains via one set of pins dedicated to communication of scan test signals. For example, in one embodiment IC reduced pin scan test method 800 facilitates the implementation of IEEE 1149.1 boundary scan testing and full scan testing via a single set of pins for communication of scan testing signals to and from exterior devices.

In Step 810 an input scan test signal associated with a plurality of scan chains is received via a first pin. In one embodiment of IC reduced pin scan test method 800, the received input scan test signal is a standard IEEE 1149.1 boundary scan signal (e.g., a TDI, TMS, TCK or TRST signal). IC reduced pin scan test method 800 utilizes the first pin to communicate scan information to different scan chains in the IC. In one embodiment of IC reduced pin scan test method 800 utilizes the first pin to communicate a TDI signal that includes data to be shifted through scan chains and data loaded in an instruction register associated with a TAP controller. In another embodiment of IC reduced pin scan test method 800 utilizes the first pin to communicate a test mode select signal (TMS) that triggers changes in a state machine of the TAP controller. In another embodiment of IC reduced pin scan test method 800 utilizes the first pin to communicate a scan clock signal (TCK).

In Step 820 additional scan operation signals associated with a plurality of scan chains are generated based upon the scan test signal received in Step 810 via the first pin. In one embodiment of IC reduced pin scan test method 800 a scan test mode signal is generated by a TAP controller that also satisfies IEEE 1149.1 standards requirements. In one example, the TAP controller generates a scan test mode signal by shifting a command in the instruction register and in another example the TAP controller utilizes its scan chain support (user modes). In one embodiment of IC reduced pin scan test method 800 a scan enable signal is asserted when the TAP controller is in shift state and the TAP controller's instruction register is loaded with a test mode instruction. A functional clock capture cycle is applied when the state machine of TAP controller is in run/idle state.

IC reduced pin scan test method 800 controls scan operations in a plurality of scan chains in step 830. The scan operations are controlled in accordance with the scan operation signal generated in response to a scan test signal received in step 810 via the first pin. In one embodiment of reduced scan pin system full scan inputs (SI) and full scan outputs (SO) in each scan DFF facilitate full scan capture and shift operations when a full scan test mode signal is active and a full scan enable signal is active (e.g., during shifting). In one example, an active full scan test mode signal disables an "open state" of a tri-state bus by driving an output enable controller for the bus to an appropriate scan test state and in one example the full scan test mode also qualifies or blocks a clock signal ("makes the clock transparent"). An active scan enable signal permits scan information to be serially received by a full scan cell and the full scan cell facilitates normal operations if the scan enable signal is not active. For example, when the full scan test mode signal and the scan enable signal are not active the IC operates in normal mode including input ports and output ports, providing normal operation communication paths for functional logic components.

In step 840 output scan test signals are transmitted off a chip from a plurality of scan chains via a second pin. For example, an IEEE 1149.1 TDO pin is used to transmit both boundary scan and full scan information off of an IC to an exterior device. In one embodiment of the present invention the outputs of the IC do not come directly from full scan cells, instead they are generated indirectly via a combination logic component (e.g., a MUX) permitting the outputs of the IC during normal function cycles to be different from those during scan test mode.

IC reduced pin scan test method 800 utilizes the normal input and output pins in another embodiment of the present invention to communicate scan information to and from an IC in both normal operation mode and scan test mode. In one example, pin scan test method 800 multiplexs between normal operation signals and scan serial signals. For example, additional scan input is achieved by utilizing a "scan enable" signal derived from a run-test/idle state in a TAP controller to control multiplexing of signals from functional nodes (e.g., normal operation inputs and normal operation outputs). One embodiment of IC reduced pin scan test method 800 includes a step in which a clock signal is multiplied or divided and the resulting signals are utilized as clock signals in scan chains. In one example, IC reduced pin scan test method 800 provides the ability to select which clock signal is utilized by a scan chain facilitating a choice between multiple time domains to by applied to the same scan chain.

Thus, the present invention permits appropriate scan testing of internal components while reducing the number of external pins required to perform the scan testing. The system and method of the present invention permits a designer to efficiently and effectively scan test integrated circuit components while decreasing the number of external pins dedicated to scan operations. The electronic reduced pin system and method minimizes adverse redesign impacts to existing IC designs and facilitates utilization of existing testing scan architectures.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A reduced pin full scan integrated circuit (IC) testing system comprising:

a functional logic component adapted to perform functional operations;

a plurality of scan chains coupled to said functional logic component, said plurality of scan chains adapted to scan test said functional logic component;

a controller coupled to said plurality of scan chains, said controller adapted to receive scan test signals and provide scan operation signals to said plurality of scan chains;

a set of scan test pins coupled to said controller, said set of scan test pins adapted to receive scan test signals;

a multiplexer (MUX) coupled to said controller, said MUX adapted to select between a clock domain provided by said controller and a second clock domain; and a phase lock loop (PLL)/clock generator coupled to said MUX, said PLL/clock generator adapted to provide said second clock domain to said plurality of scan chains.

2. A reduced pin full scan integrated circuit testing system of claim 1 in which said scan operation signals provided by said controller includes a scan test mode signal that directs a scan input and scan output to operate in scan mode.

3. A reduced pin full scan integrated circuit testing system of claim 1 in which said scan operation signals provided by said controller includes a scan enable signal that directs a scan cell to receive a serial input signal or capture information from said functional logic component.

4. A reduced pin full scan integrated circuit testing system of claim 1 in which said scan test signals include a scan test clock signal.

5. A reduced pin full scan integrated circuit testing system of claim 1 further comprising a normal operation input pin coupled to said functional logic component, said normal operation input pin adapted to provide an input communication path between exterior devices and said functional logic component during normal operations and adapted to provide an alternate communication path between exterior devices and said scan chain logic during scan test operations.

6. A reduced pin full scan integrated circuit testing system of claim 1 further comprising a normal operation output pin coupled to said functional logic component; said normal operation output pin adapted to provide an output communication path between exterior devices and said functional logic component during normal operations and adapted to provide an alternate communication path between exterior devices and said scan chain logic during scan test operations.

7. A reduced pin full scan integrated circuit (IC) testing system comprising:

a set of scan test pins adapted to receive standard International Electrical and Electronic Engineering (IEEE) 1149.1 boundary scan test signals a test access port (TAP) controller coupled to said set of scan test pins, said TAP controller adapted to receive scan test signals from said set of scan test pins and provide boundary scan operation signals to a boundary scan test chain and full scan operation signals to a full scan test chain;

a multiplexer (MUX) coupled to said TAP controller, said MUX adapted to select between a clock domain provided by said TAP controller and a second clock domain; and a phase lock loop (PLL)/clock generator coupled to said MUX, said PLL/clock generator adapted to provide said second clock domain to said full scan test chain.

8. A reduced pin full scan integrated circuit testing system of claim 7 in which said scan test signals include a boundary scan test mode select signal and a boundary scan test clock signal and said scan operation signals include a boundary scan select signal, boundary scan enable signal, a full scan test mode signal and a full scan enable signal.

9. A reduced pin full scan integrated circuit testing system of claim 7 further comprising:

a logic gate adapted to gate multiple clocks individual; and a phase lock loop (PLL)/clock generator coupled to said MUX, said PLL/clock generator adapted to provide said second clock domain.

10. A reduced pin full scan integrated circuit testing system of claim 7 in which said IC operates in scan mode when both a full scan test mode signal and a full scan enable signal is active.

11. A reduced pin full scan integrated circuit testing system of claim 7 in which said full scan operation signals provided by said TAP controller includes a scan test mode signal that is programmed by said TAP controller.

12. A reduced pin full scan integrated circuit testing system of claim 7 in which said full scan operation signals provided by said TAP controller includes a scan enable signal that is asserted when said TAP controller is in shift state and an instruction register is loaded with a test mode instruction.

13. A reduced pin full scan integrated circuit testing system of claim 7 in which a functional clock capture cycle is applied when a state machine of said TAP controller is in run/idle state.

14. An integrated circuit reduced pin scan test method of claim 13 in which said received input scan test signal is a standard International Electrical and Electronic Engineering (IEEE) 1149.1 boundary scan signal.

15. An integrated circuit reduced pin scan test method of claim 13 further comprising the step of communicating scan information to different scan chains in the IC.

16. An integrated circuit reduced pin scan test method of claim 13 further comprising the step of utilizing said first pin to communicate a test mode select signal (TMS) that triggers changes in a state machine included in an TAP controller that also satisfies International Electrical and Electronic Engineering (IEEE) 1149.1 standards requirements.

17. An integrated circuit reduced pin scan test method of claim 13 further comprising the steps of:

generating a scan test mode signal by a test access port (TAP) controller that also satisfies International Electrical and Electronic Engineering (IEEE) 1149.1 standards requirements; and asserting a scan enable signal by said TAP controller.

18. An integrated circuit reduced pin scan test method of claim 17 in which said scan test mode signal is generated by shifting a command in an instruction register.

19. An integrated circuit reduced pin scan test method of claim 17 in which said scan enable signal is asserted when a test access port (TAP) controller is in shift state and said TAP controller's instruction register is loaded with a scan test mode instruction.

20. An integrated circuit (IC) reduced pin scan test method comprising the steps of:

receiving an input scan test signal associated with a plurality of scan chains via a first pin;

generating additional scan operation signals associated with said plurality of scan chains based upon said input scan test signal received via said first pin;

controlling scan operations in said plurality of scan chains in accordance with said input scan test signal received via said first pin;

transmitting output scan operation signals off a chip from said plurality of scan chains via a second pin;

selecting between a first clock domain signal from a controller and a second clock domain signal; and providing said second clock domain to said plurality of scan chains from a phase lock loop (PLL)/clock generator coupled to a MUX.

21. An integrated circuit reduced pin scan test method of claim 20 further comprising the step of facilitating full scan capture and shift operations when a full scan test mode signal is active and a full scan enable signal is active.

22. An integrated circuit reduced pin scan test method of claim 20 further comprising the steps of:

operating in a normal mode; and providing normal operation communication paths for a functional logic component.

23. An integrated circuit reduced pin scan test method of claim 20 in which an output of said IC is generated indirectly via a combination logic component by permitting outputs of said IC during normal function cycles to be different from those during scan test mode.

24. An integrated circuit reduced pin scan test method of claim 20 further comprising the step of using a normal input pin and normal output pin to communicate scan information to and from said IC.

25. An integrated circuit reduced pin scan test method of claim 24 further comprising the step of multiplexing between normal operation signals and scan serial signals.

26. An integrated circuit reduced pin scan test method of claim 25 in which a "scan enable" signal derived from a run-test/idle state in a test access port (TAP) controller is used to control multiplexing of signals from functional nodes.

* * * * *